United States Patent [19]

Koyabu

[11] Patent Number: 4,695,866
[45] Date of Patent: Sep. 22, 1987

[54] SEMICONDUCTOR INTEGRATED CIRCUIT DEVICE

[75] Inventor: Kunihiro Koyabu, Tokyo, Japan

[73] Assignee: NEC Corporation, Tokyo, Japan

[21] Appl. No.: 655,718

[22] Filed: Sep. 28, 1984

[30] Foreign Application Priority Data

Sep. 28, 1983 [JP] Japan .................................. 58-179601

[51] Int. Cl.⁴ .............................................. H01L 27/02
[52] U.S. Cl. ...................................... 357/42; 357/23.1; 357/41
[58] Field of Search ........................... 357/23.1, 41, 42

[56] References Cited

FOREIGN PATENT DOCUMENTS 55-61056  5/1980  Japan ..................................... 357/59

Primary Examiner—Andrew J. James
Assistant Examiner—Mark Prenty
Attorney, Agent, or Firm—Burns, Doane, Swecker & Mathis

[57] ABSTRACT

An improved layout configuration of an MOS transistor circuit is disclosed, which includes a plurality of series-connected insulated gate field effect transistors with a single common gate electrode. The plurality of transistors have their source and drain regions and channel regions positioned in an active region of U-shape or zig-zag shape in plane configuration delimited in a semiconductor substrate. On the other hand, the common gate electrode for all the transistors is formed of a single conducting layer extending in one direction or a single conducting layer having a component extending in one direction and a component extending in the direction at right angles to this one direction. According to such a layout configuration, the mentioned transistor circuit can be provided at a high integration density. This layout can be applied to a C-MOS inverter having a desired high value of an ON resistance which consists of a plurality of p-channel type unit transistors connected in series with one another and a plurality of n-channel type unit transistors connected in series with one another.

3 Claims, 18 Drawing Figures

SEMICONDUCTOR INTEGRATED CIRCUIT DEVICE

BACKGROUND OF THE INVENTION

The present invention relates to a semiconductor integrated circuit device, and more particularly to a semiconductor integrated circuit device including a logic delay circuit.

Heretofore, a semiconductor integrated circuit has been more and more required to have high integration density, and according to the requirement, a micro-fine working technique has been developed. In addition, realization of a high integration density is being investigated with respect to the aspect of layout to avoid a dead space in the arrangement of circuit elements on a semiconductor substrate. For a circuit of a plurality of series-connected insulated gate field effect transistors (hereinafter abbreviated as MOST's) with a source and a drain, respectively, of adjacent MOST's connected in common, also a high integration density must be realized. Especially, for a CMOS inverter circuit of a plurality of n-channel type insulated gate field effect transistors (hereinafter abbreviated as nMOST's) and a plurality of p-channel type insulated gate field effect transistors (hereinafter abbreviated as pMOST's), also likewise a high integration density must be realized. Such CMOS inverter is frequently used in a logic delay circuit.

SUMMARY OF THE INVENTION

One object of the present invention is to provide a semiconductor integrated circuit device having a high integration density and including a circuit in which a plurality of MOST's are connected in series.

Another object of the present invention is to provide a semiconductor integrated circuit device, in which a CMOS inverter including a plurality of nMOST's and a plurality of pMOST's can be formed at a high integration density.

Still another object of the present invention is to provide a semiconductor integrated circuit device, in which a logic delay circuit can be realized at a high integration density in the case where the logic delay circuit is formed of a plurality of CMOS inverters conncted in cascade, each CMOS inverter being comprized of a plurality of nMOST's and a plurality of pMOST's.

According to one feature of the present, there is provided a semiconductor integrated circuit device comprising a semiconductor substrate, a transistor forming region delimited on one major surface of the semiconductor substrate and including a first portion extending in one direction and second and third portions connected to the first portion and extending in parallel to each other and in the direction at right angles to the one direction so as to form U shape in the plan view, a gate electrode extending in the one direction so as to cross the second and third portions of the transistor forming region, a first channel region of a first MOST provided in the second portion of the transistor forming region under the gate electrode, a second channel region of a second MOST provided in the third portion of the transistor forming region under the gate electrode, and source and drain regions of the first and second MOST's provided in a substantially whole parts of the transistor forming region except said channel regions so that the first and second MOST's are connected each other in series by the source or drain region in the first portion of the transistor forming region.

According to another feature of the present invention, there is provided a semiconductor integrated circuit device comprising a semiconductor substrate, a transistor forming region delimited on a principal surface of one conductivity type region of the semiconductor substrate and including of a first rectilinear portion extending in one direction and second and third rectilinear portions connected to the opposite ends of said first rectilinear portion and extending in parallel to each other and in the direction at right angles to the one direction so as to form U shape, repeated wave shape or zig-zag-shape thereof in the plan configuration, a single gate electrode extending over channel forming locations in the first, second and third rectilinear portions, and source, drain regions of the opposite conductivity type provided in the locations other than the channel forming locations of the transistor forming region so that a plurality of MOST's are connected in series with each other.

According to still another feature of the present invention, there is provided a semiconductor integrated circuit device comprising a first active region delimited on a major surface of an n-type region in a semiconductor substrate and having components extending respectively in one direction and in the direction at right angles to the one direction, a second active region delimited on a major surface of a p-type region in the semiconductor substrate and having components extending respectively in one direction and in the direction at right angles to the one direction, a plurality of pMOST's provided in the first active region and connected in series with one another, and a plurality of nMOST's provided in the second active region and connected in series with one another. The gate electrodes of the p-MOST's and the n-MOST's may be formed by a single conductive layer extending in the one direction or by a single conductive layer having components extending in the one direction and in the direction at right angles to the one direction, and a single CMOS transistor may be formed by these pMOST's and nMOST's. Such a CMOS transistor may forms a part of a logic delay circuit.

DESCRIPTION OF THE PRIOR ART

Figure 1:
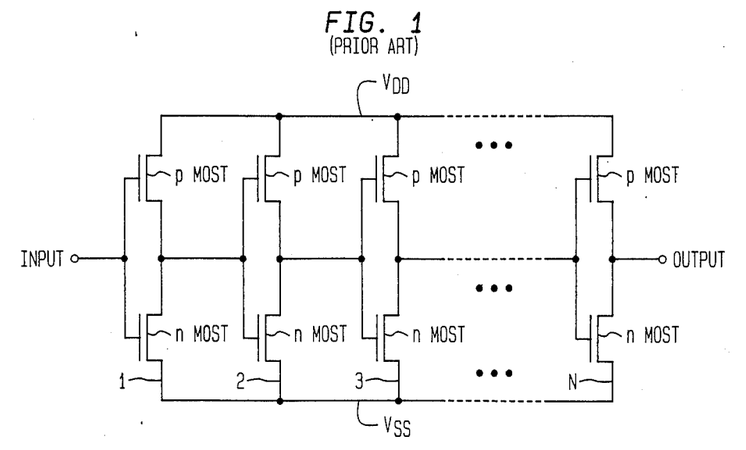
FIG. 1 is a circuit diagram showing a logic delay circuit making use of CMOS inverters.

In a delay circuit shown in FIG. 1, a plurality (N) of CMOS inverters 1, 5, ..., N are connected in cascade between an input terminal and an output terminal. Each CMOS inverter is comprised of a pair of P- and N-MOST's connected in series between two power supply lines $V_{DD}$ and $V_{SS}$. One of these two power supply lines could be a ground line. Each CMOS inverter serves as a load capacitor C for the CMOS inverter in the preceding stage, and it forms a charging/discharging circuit for the capacitor of the CMOS inverter in the succeeding stage. For instance, the inverter 2 forms a load capacitor for the inverter 1. On the other hand, by turning ON the pMOST of the inverter 2, the load capacitor formed by the inverter 3 is charged, and by turning ON the nMOST of the same inverter 2, the above-mentioned load capacitor is discharged. Accordingly, in order to set the delay time at a desired large value, the resistances of the pMOST and the nMOST under an ON condition must have a large value such as, for example, several ten KΩ to one hundred KΩ. To that end, a channel width W (See FIG. 2A) should be narrowed in each MOST and a channel length L (See FIG. 2A) should be elongated. However, this measure is still not satisfactory to realize a desired value, and another measure is used in which a plurality of pMOST's and a plurality of nMOST's are connected in series to form a single CMOS inverter.

Figure 2A:
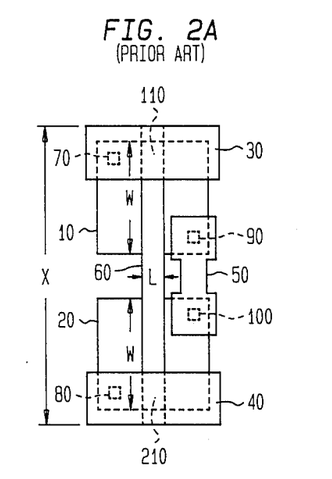
FIG. 2A is a plan view in prior at showing a CMOS inverter.
Figure 2B:
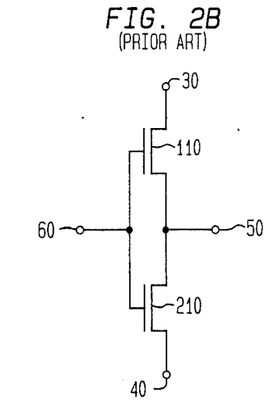
FIG. 2B is a circuit diagram of the CMOS inverter shown in FIG. 2A.

With reference to FIGS. 2A and 2B, a CMOS inverter is formed of one pMOST 110 and one nMOST 210. More particularly, a common gate electrode 60 formed of a polycrystalline silicon layer and a silicide layer thereon is connected to a CMOS inverter in the preceding stage or an input of a delay circuit, and on the other hand, a metal wiring layer 50 made of aluminum or the like which is connected at a contact portion 90 to one of p-type source and drain regions of the pMOST 110 and also connected at a contact portion 100 to one of n-type source and drain regions of the nMOST 210, is connected a CMOS inverter in the succeeding stage or an output of the delay circuit. One of the power supply lines $V_{DD}$ and $V_{SS}$ is formed of a metal wiring layer 30 made of aluminum or the like and is connected at a contact portion 70 to the other of the p-type source and drain regions of the pMOST 110, while the other of the above-described power supply lines is formed of a metal wiring layer 40 made of aluminum or the like and is connected at a contact portion 80 to the other of the n-type source and drain regions of the nMOST 210. In this CMOS inverter, a channel length L of each MOST is almost the same value as a width of a gate electrode, for example, 5 μm, but a channel width W is, for example, 40 μm. In order to enlarge an ON resistance of each of these MOST's it may be conceived to make the channel width W small, but naturally reduction of the channel width has a limit. In addition, an outer distance X between the respective power supply lines 30 and 40 is, for example, 110 μm, and the positions of these power supply lines are determined in relation to other elements in the same integrated circuit. It is to be noted that transistor forming regions 10 and 20 in which pMOST and nMOST are to be formed, respectively, are surrounded by a field oxide film, and in the case of employing an n-type semi-conductor substrate, nMOST's are formed within a p-well. However, since these matters are self-explanatory, illustration thereof will be omitted.

Figure 3A:
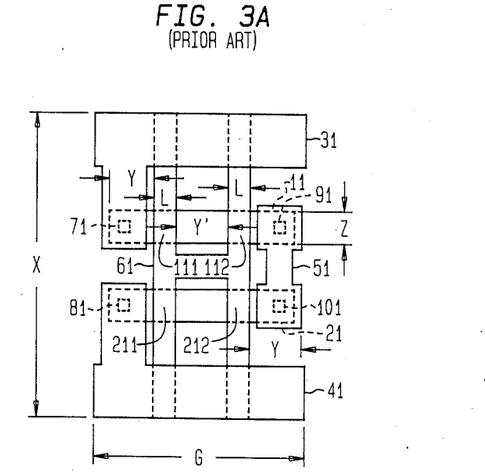
FIGS. 3A, 4A and 5A are plan view respectively showing CMOS inverter in the prior art to be used in a logic delay circuit.
Figure 3B:
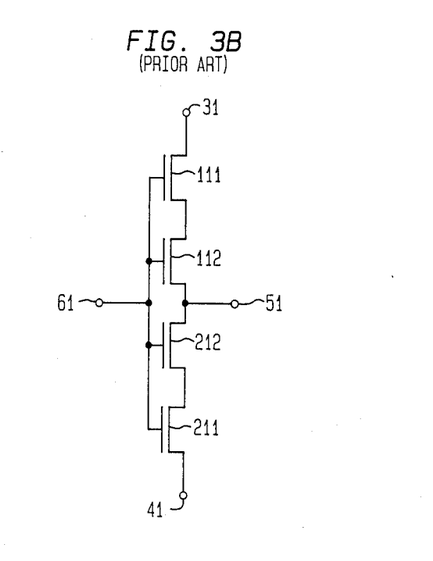
FIGS. 3B, 4B and 5B are circuit diagrams of the CMOS inverters shown in FIGS. 3A, 4A and 4B, respectively.

FIGS. 3A and 3B show a CMOS inverter in which in order to increase an ON resistance of the CMOS inverter in FIGS. 2A and 2B, two pMOST's 111 and 112 are connected in series and two nMOST's 212 and 211 are connected in series. More particularly, the two pMOST's are formed in a transistor forming region 11, and two nMOST's are formed in a transistor forming region 21. Each transistor forming region has a rectangular shape, and as the width of the rectangular shape is selected, for instance, to be 10 μm, a channel width of each MOST is also 10 μm. On the other hand, a width of a gate electrode 61 which serves as an input to this CMOS inverter, that is, a channel length L is equal to about 5 μm similarly to the CMOS inverter. Accordingly, in addition to the reduction of the channel width, two MOST's are connected in series in the respective channel types, and so, the ON resistance becomes large.

In addition, with reference to this FIG. 3A, a length Y of a source or diam region in each of the pMOST's and the nMOST's is chosen to be 15 μm. This size is determined, taking into consideration a deviation in pattern registeration, on the basis of the fact that the respective areas of a contact hole 91 through which a metal wiring layer 51 serving as an output of the CMOS inverter is connected to the p-type source or drain region, a contact hole 101 through which the metal wiring layer 51 is connected to the n-type source or drain region, a contact hole 71 through which a $V_{SS}$ power supply line 31 is connected to the p-type source or drain region, and a contact hole 81 through which a $V_{SS}$ power supply line 41 is connected to the n-type source or drain region, are squares of 4 μm ×4 μm. On the other hand, the length Y' of the p-type region that is common to the pMOST's 111 and 112 and the n-type region that is common to the nMOST's 211 and 212 also necessitates to be 15 μm. This is necessary for the purpose of making it possible to apply the so-called "Gate Array"0 in which the wiring layer 51 formed at a time close to the final step could be provided as displaced to these regions, and also it is because automation of design becomes possible for the purpose of designing transistors of the same shape. In such a prior art, an outer distance X between the respective power supply lines is 110 μm like to CMOS inverter shown in FIG. 2A, while a dimension G is as long as 55 to 60 μm. It is to be noted that in FIG. 3A, a field oxide film and a p-well are not illustrated similarly to FIG. 2A.

Figure 4A:
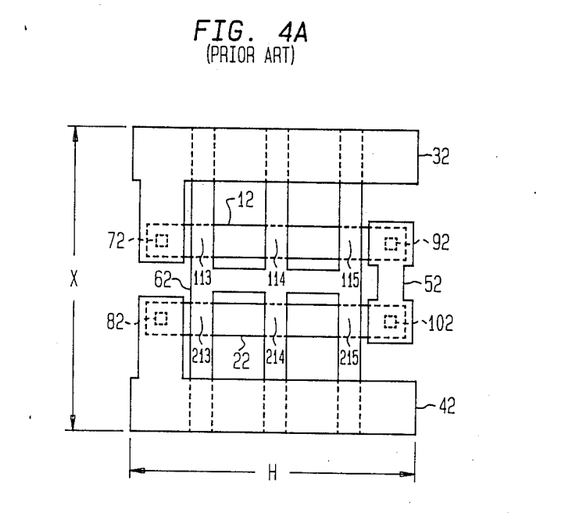
Figure 4B:
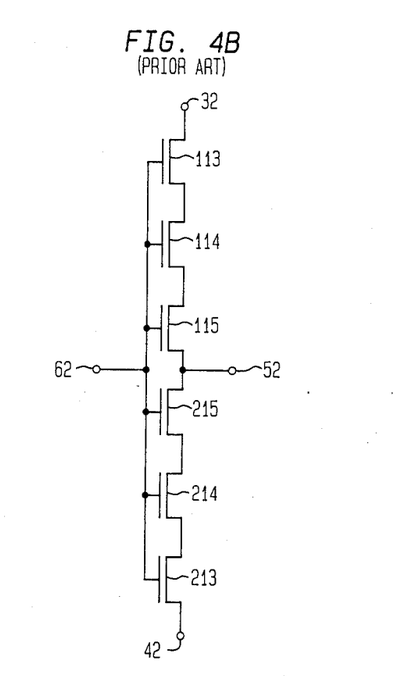

Likewise, in a CMOS inverter in which pMOST's are respectively connected in series as shown in FIGS. 4A and 4B, a lengthwise dimension H is 75 to 80 μm. The dimensions of the portions in FIG. 4A corresponding to the portions in FIG. 3A are the same. More particularly, in FIG. 4, three pMOST's 113, 114, and 115 are provided in a transistor forming region 12, and three nMOST's 213, 214 and 215 are provided in a transistor forming region 22. A $V_{DD}$ metal wiring 32 is connected through a contact hole 72 to one of the source and drain regions of the pMOST 113, and a $V_{SS}$ metal wiring 42 is connected through a contact hole 82 to one of the source and drain regions of the nMOST 213. An input of this CMOS inerter is connected to a gate electrode 62, while an output of this CMOS inverter is derived via a metal wiring layer 52 which is connected through a contact hole 92 to one of the source and drain regions of the pMOST 115 and connected through a contact hole 102 to one of the source and drain regions of the nMOST 215.

Figure 5A:
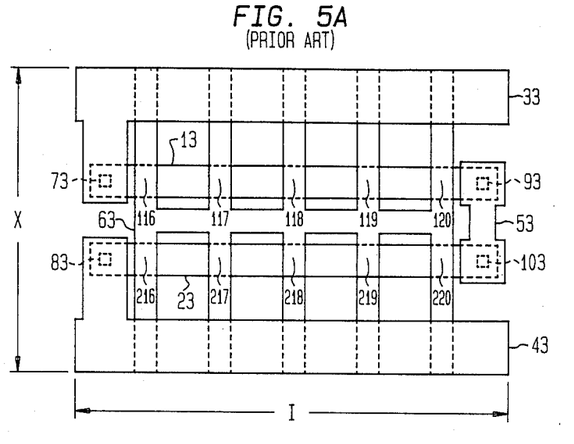
Figure 5B:
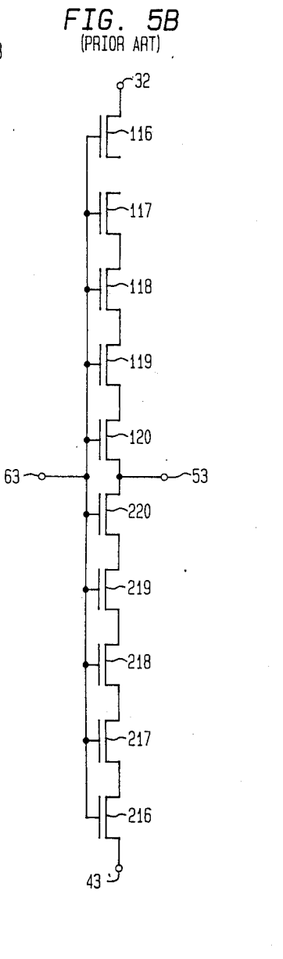

In a CMOS inverter shown in FIGS. 5A and 5B, pMOST's and nMOST's are respectively connected serially in five stages, and a lengthwise dimension I is 110 to 120 μm. In FIG. 5A, portions corresponding to those shown in FIG. 3A have the same dimensions. More particularly, in FIG. 5A, five pMOST's 116, 117, 118, 119 and 120 are provided in a transistor forming region 13, and five nMOST's 216, 217, 218, 219 and 220 are provided in a transistor forming region 23. A $V_{DD}$ metal wiring layer 33 is connected through a contact hole 73 to one of the p-type source and drain regions of the pMOST 116, while a $V_{SS}$ wiring layer 43 is connected through a contact hole 83 to one of the n-type source and drain regions of the nMOST 216. An input of this CMOS inverter is connected to a gate electrode 63. On the other hand, a metal wiring layer 53 which is connected through a contact hole 93 to one of the p-type source and drain regions of the pMOST 120 and connected through a contact hole 103 to one of the n-type source and drain regions of the nMOST 220, serves as an output line of this CMOS inverter.

DESCRIPTION OF THE PREFERRED EMBODIMENTS

Figure 6A:
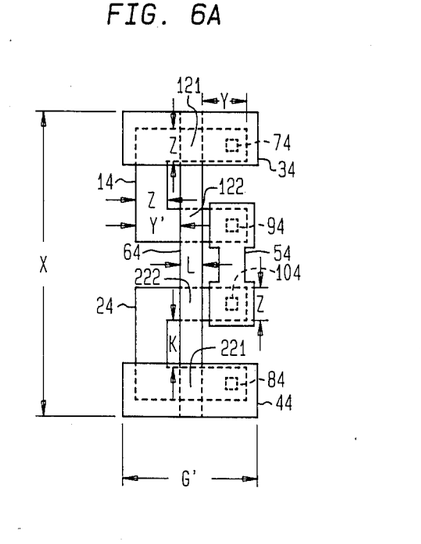
FIG. 6A is a plan view showing a CMOS inverter according to a first preferred embodiment of the present invention.
Figure 6B:
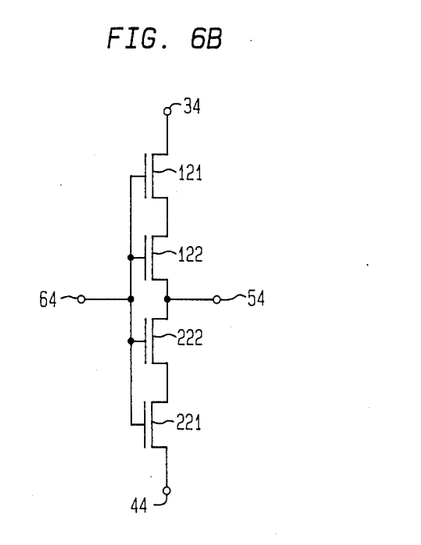
FIG. 6B is a circuit diagram of the CMOS inverter shown in FIG. 6A.

A first preferred embodiment illustrated in FIG. 6 provides a CMOS inverter in which two pMOST's and two nMOST's are respectively connected in series similarly to that in the prior art shown in FIG. 3. Only difference from the CMOS inverter in FIG. 3A resides in that two pMOST's 121 and 122 are provided in a transistor forming region 14 of U-shape in plan configuration, and two nMOST's 221 and 222 are also provided in a transistor forming region 24 of U-shape in plan configuration. The transistor forming regions 14 and 24 have an identical shape and are surrounded by a field insulator film (not shown). In more particular, the transistor forming regions 14 and 24 have a constant width Z of 10 μm and an inside dimension K of 20 μm. That is, each of the transistor forming regions consists of a main portion extending in the longitudinal direction as viewed in FIG. 6A and two branch portions projecting laterally from the opposite ends of the main portion, and a single gate electrode 64 extends over these branch portions of the both transistor forming regions. This gate electrode is formed of polycrystalline silicon, and serves as a mask when a p-type impurity and an n-type impurity, respectively, is introduced into the respective transistor forming regions in a self registered manner to form respective types of source and drain regions. Since a metal silicide layer is deposited over this polycrystalline silicon layer, pn-diodes formed in the polycrystalline silicon layer can be effectively short-circuited. In addition, a metal wiring layer 34 for supplying a voltage $V_{DD}$ is connected through a contact hole 74 of square shape of 4 μm × 4 μm to one of the p-type source and drain regions of the pMOST 121. A length Y of this one region is 15 μm. Likewise, a metal wiring layer 44 for supplying a voltage $J_{SS}$ is also connected through a similar contact hole 84 to one of the n-type source and drain regions of the nMOST 221. In addition, a metal wiring layer 54 serving as an output line of this CMOS inverter is also connected through similar contact holes 94 and 104, respectively, to a p-type source or drain region and an n-type source or drain region. In the illustrated embodiment, since the width L of the gate electrode 64 is 5 μm, like the CMOS inverter in FIG. 3 the channel length of the respective MOST's is nearly equal to 5 μm. Since the distance Y' of the outer edge of the main portion of the transistor forming region from the gate electrode is selected to be 15 μm, in some cases a CMOS inverter including a single stage of a pMOST and nMOST can be formed by displacing the metal wiring layer 54 to the left side of the gate electrode 64. That is, '37 Gate Array" is possible.

As described above, if MOST's having the same channel length and the same channel width as those used in the CMOS inverter shown FIG. 3A are formed in a layout as shown in FIG. 6A, then even though the outer distance X between the respective power supply lines is held at the constant value of 110 μm, a lateral dimension G' is reduced to 35 to 40 μm, and thereby an integration density is enhanced as compared to the device shown in FIG. 3.

FIG. 7 shows a second preferred embodiment of the present invention, in which a CMOS inverter is formed by connecting three pMOST's and three nMOST's, respectively, in series similarly to that in the prior art shown in FIG. 4. In FIG. 7A, plan configurations and dimensions of the portions corresponding to those shown in FIG. 6A are exactly the same. However, only difference exists in that in the CMOS inverter shown in FIG. 7A, branch portions are projected leftwardly, as viewed in this figure, from the rectilinear gate electrode to form respective additional MOST's. Accordingly, a lateral dimension H' of the CMOS inerter shown in FIG. 7A is 35 to 40 μm similarly to the lateral dimension G' of the CMOS inverter shown in FIG. 6A, and thus it is seen that the dimensions of the CMOS inverter can be greatly reduced as compared to that in the prior art shown in FIG. 4.

More particularly, pMOST's 123, 124, and 125 are provided in a U-shaped transistor forming region 15, while nMOST's 223, 224 and 225 are provided in a U-shaped transistor forming region 25. A gate electrode 65 serving as an input terminal includes a rectilinear portion and two branch portions. A metal wiring layer 35 for a $V_{DD}$ power supply is connected through a contact hole 75 to the p-type region of the pMOST 123, and a metal wiring layer 45 for a $V_{SS}$ power supply is connected through a contact hole 85 to the n-type region of the nMOST 223. In addition, if the wiring layer 55 is positioned on the left side of the gate electrode 65 as viewed in FIG. 7A, then the CMOS inverter can be converted to a CMOST inverter consisting of two stages of pMOST's and nMOST's connected in series, respectively.

Figure 7A:
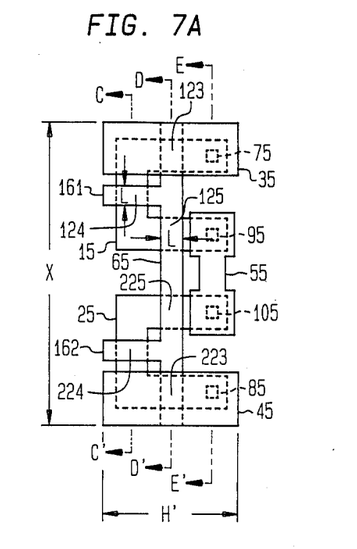
FIG. 7A is a plan view showing a CMOS inverter according to a second preferred embodiment of the present invention.
Figure 7B:
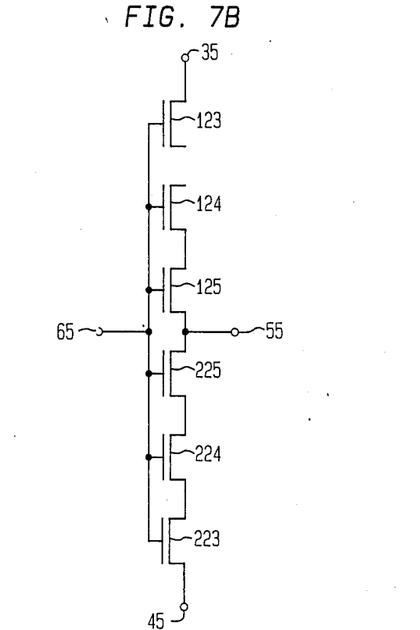
FIG. 7B is a circuit diagram of the CMOS inverter shown in FIG. 7A.
Figure 7C:
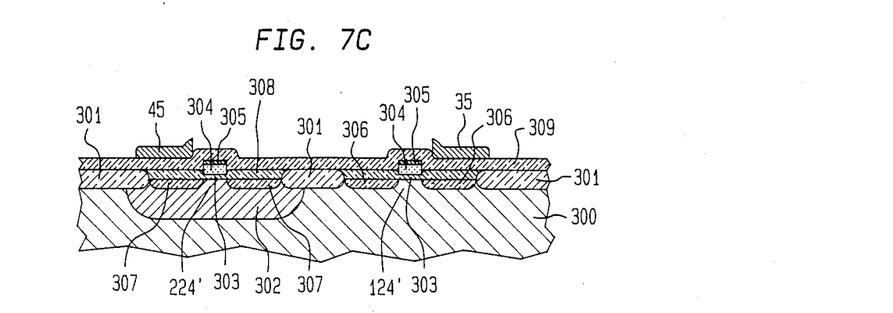
FIGS. 7C, 7D, and 7E are cross-sectional views taken along line C—C', line D—D' and line D—E' FIG. 7A as viewed in the direction of arrows.
Figure 7D:
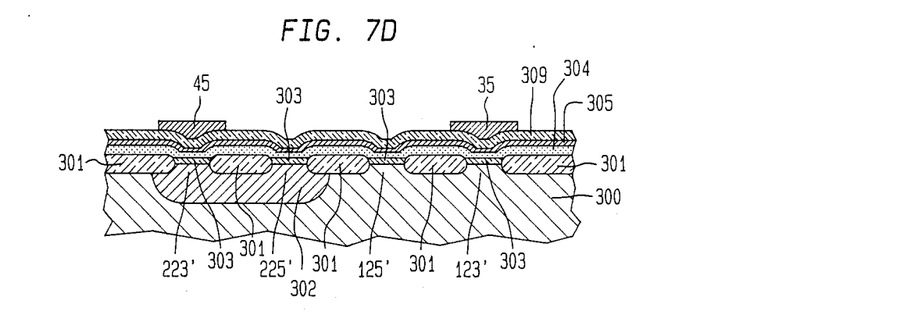
Figure 7E:
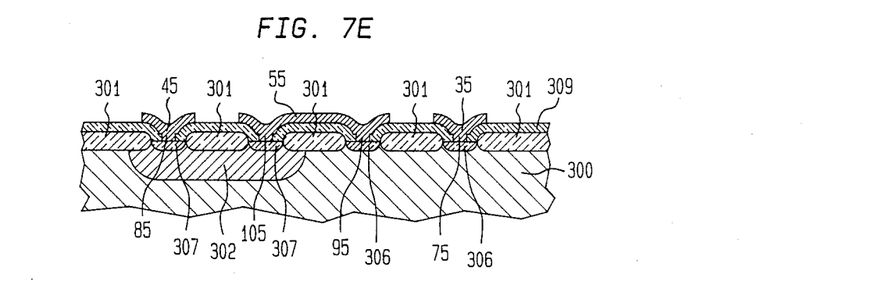

Now description will be made on a detailed cross-sectional structures of the CMOS inverter shown in FIG. 7A, with reference to FIGS. 7C, 7D and 7E. With regard to the other CMOS inverters for which only plan views are shown, one may consider that they also have similar cross-sectional structures. On an n-type semiconductor substrate 300 is selectively formed a field oxide film 301 which surrounds the transistor forming regions 15 and 25. In the region 25 in which the respective nMOST are to be provided, is preliminary provided a p-well 302. A polycrystalline silicon gate 304 is formed on a thin gate oxide film 303. A p-type impurity is introduced by making use of this polycrystalline silicon gate 304 as a part of a mask, and thereby p-type source and drain regions 306 are formed. On the other hand, an n-type impurity is likewise introduced and thereby n-type source and drain regions 307 are formed. In addition, a silicon oxide film 308 is provided, and a layer 305 of silicide of platinum, molybdenum, etc. is formed on the polycrystalline silicon gate 304. Thereby, pn-junctions formed in the polycrystalline silicon layer during the introduction of the above-mentioned p-type and n-type impurities, are short-circuited, and the gate electrode 65 is formed of these polycrystalline silicon layer 304 and the silicide layer 305. Subsequently, an insulating film 309 such as a silicon oxide film is deposited through a CVD process, then contact holes 75, 95, 105, and 85 are formed therein, and metal wiring layers 35, 55 and 45 of aluminum or the like are formed. It is to be noted that in FIGS. 7C, 7D, and 7E, reference numerals 124′, 224′, 123′, 125′, 225′ and 223′ designate channel regions of the MOST's 124, 224, 123, 125, 225, and 223, respectively.

Figure 8A:
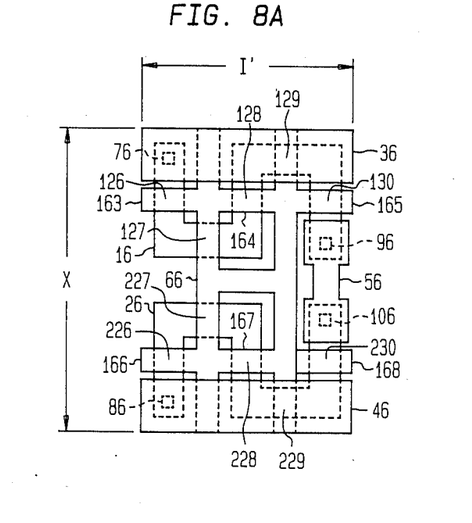
FIG. 8A is a plan view showing a CMOS inverter according to a third preferred embodiment of the present invention.
Figure 8B:
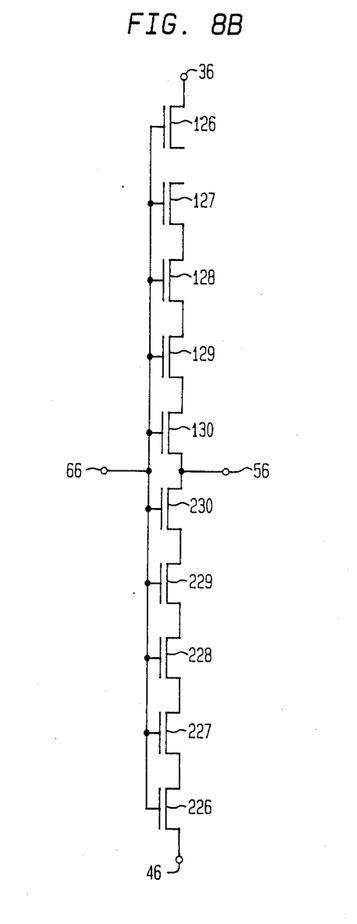
FIG. 8B is a circuit diagram of the CMOS inverter shown in FIG. 8A.

A third preferred embodiment shown in FIG. 8 provides a CMOS inverter in which five pMOST's and five nMOST's are respectively connected in series. An outer distance X between the respective power supply line wirings is 110 μm, and a dimension I′ in the lateral direction is about 60 μm. This lateral dimension is widely reduced as compared to the CMOS inverter in the prior art having the same circuit construction as shown in FIG. 5. In FIG. 8, those portions having the same functions as the corresponding portions in FIGS. 6 and 7 are formed in the same dimensions.

More particularly, a transistor forming region 16 in which pMOST's 126, 127, 128, 129 and 130 are formed, has a width of 10 μm and is formed in a zig-zag shape consisting of two U-shapes jointed together. Likewise, a transistor forming region 26 in which nMOST's 226, 227, 228, 229, and 230 are formed, is also formed in a zig-zag shape. A gate wiring 66 which serves as an input terminal for this CMOS inverter, is disposed so as to cross the respective rectilinear portions of the zig-zag shape, and thus forms gate electrodes of the respective MOST's. In addition, a metal wiring layer 36 for a $V_{DD}$ power supply is connected through a contact hole 76 to one of the p-type source and drain regions of the pMOST 126, and a metal wiring layer 46 for a $V_{SS}$ power supply is connected through a contact hole 86 to one of the n-type source and drain regions of the nMOST 226. Furthermore, a metal wiring layer 56 serving as an output of this CMOS inverter is connected through a contact hole 96 to one of the p-type source and drain regions of the pMOST 130, and also connected through a contact hole 106 to one of the n-type source and drain regions of the nMOST 230.

What is claimed is:

1. A semiconductor integrated circuit device comprising a semiconductor substrate, a transistor forming region provided in a major surface of one conductivity type region of said semiconductor substrate and including a first rectilinear portion extending in one direction and second and third rectilinear portions connected to the opposite ends of said first rectilinear portion and extending in parallel to each other and in a direction at right angles to said one direction, a single gate electrode including a main portion extending in said one direction and crossing over channel forming locations of said second and third rectilinear portions, respectively and a branch portion connected to a part of said main portion extending in the direction at a right angle to said one direction to cross over a channel forming location of said first rectilinear portion, and source and drain regions of the opposite conductivity type provided in the locations other than said channel forming locations of said transistor forming region.

2. A semiconductor integrated circuit device comprising a first active region provided in a major surface of a semiconductor substrate having a first portion extending in one direction, a second portion contiguously connected to said first portion and extending at a right angle to said one direction, a second active region provided in a major surface of said semiconductor substrate, separated from said first active region and having a third portion extending in said one direction and a fourth portion contiguously connected to said third portion and extending in the direction at a right angle to said one direction, a gate electrode including first and second parts extending in said one direction and crossing over said second and fourth portions, respectively, and third and fourth parts extending in the direction at a right angle to said one direction and crossing over said first and third portions, respectively, p-type source and drain regions formed in said first and second portions of said first active region except areas under said first and third parts of said gate electrode to form a plurality of P-channel type insulated gate field effect transistors connected in series with one another, and N-type source and drain regions formed in said third and fourth portions of said second active region except areas under said second and fourth parts of said gate electrode to form a plurality of N-type insulated gate field effect transistors connected in series with one another.

3. A semiconductor integrated circuit device as claimed in claim 2, in which one of the source and drain regions of the transistor positioned at one end among said plurality of p-channel type transistors connected in series with one another, is connected to a first power supply line, and one of the source and drain regions of the transistor positioned at one end among said plurality of n-channel type transistors connected in series with one another, is connected to a second power supply line.

* * * * *